United States Patent
Kurotori et al.

(10) Patent No.: US 7,667,471 B2
(45) Date of Patent: Feb. 23, 2010

(54) CONTACT PIN PROBE CARD AND ELECTRONIC DEVICE TEST APPARATUS USING SAME

(75) Inventors: Fumio Kurotori, Tokyo (JP); Takaji Ishikawa, Tokyo (JP); Tadao Saito, Tokyo (JP)

(73) Assignee: Advantest Corporation, Tokyo (JP)

( * ) Notice: Subject to any disclaimer, the term of this patent is extended or adjusted under 35 U.S.C. 154(b) by 476 days.

(21) Appl. No.: 10/566,463

(22) PCT Filed: Dec. 14, 2004

(86) PCT No.: PCT/JP2004/018652

§ 371 (c)(1),
(2), (4) Date: Jan. 30, 2006

(87) PCT Pub. No.: WO2006/064546

PCT Pub. Date: Jun. 22, 2006

(65) Prior Publication Data

US 2008/0143366 A1  Jun. 19, 2008

(51) Int. Cl.
*G01R 31/02* (2006.01)
(52) U.S. Cl. ...................................... 324/754
(58) Field of Classification Search ................. 324/754, 324/761–762, 765, 158.1; 250/306, 234; 438/14–18; 257/48
See application file for complete search history.

(56) References Cited

U.S. PATENT DOCUMENTS 5,581,083 A * 12/1996 Majumdar et al. .......... 250/306
5,923,178 A * 7/1999 Higgins et al. ............. 324/754
5,986,261 A * 11/1999 Lewis et al. ................ 250/306
6,573,738 B1   6/2003 Matsuo et al.
2004/0239355 A1 12/2004 Kazama

FOREIGN PATENT DOCUMENTS

| CN | 1336549 A | 2/2002 |
|---|---|---|
| EP | 1 202 337 A2 | 5/2002 |
| JP | 06-313774 A | 11/1994 |
| JP | 9-089930 A | 4/1997 |
| JP | 10-319039 A | 12/1998 |
| JP | 11-160355 A | 6/1999 |
| JP | 3215452 B2 | 7/2001 |
| JP | 2003-14779 A | 1/2003 |
| WO | WO-03/005043 A1 | 1/2003 |
| WO | WO-02/27689 A1 | 4/2003 |

* cited by examiner

*Primary Examiner*—Ha Tran T Nguyen
*Assistant Examiner*—Tung X Nguyen
(74) *Attorney, Agent, or Firm*—Birch, Stewart, Kolasch & Birch, LLP

(57) ABSTRACT

A contact pin (50) for contacting a terminal of a wafer and supplying a signal to that wafer is provided with a first conductive layer (51b) composed of a first conductive material having a relatively higher hardness than the oxide film formed on the terminal of the wafer, a second conductive layer (51c) composed of a second conductive material having a relatively lower hardness than the oxide film, and a base material (51a) with the first conductive layer (51b) and second conductive layer (51c) formed at the outside, the first conductive layer (51b) being formed so as to closely contact the outside of the second conductive layer (51c), the first conductive layer (51b) and second conductive layer (51c) both being exposed at the front end face (50a) of the contact pin (50).

21 Claims, 12 Drawing Sheets

CONTACT PIN PROBE CARD AND ELECTRONIC DEVICE TEST APPARATUS USING SAME

TECHNICAL FIELD

The present invention relates to a contact pin for contacting a terminal of an electronic device and supplying that electronic device with a signal and to a probe card and electronic device test apparatus using the same.

BACKGROUND ART

When producing an IC device or other electronic device having a semiconductor integrated circuit, the integrated circuit is subjected to an operation test not only at the stage of the finished product after dicing, wire bonding, packaging, and other steps (post-process), but also usually at the stage of the semiconductor wafer (pre-process). Due to this, an improvement in the production yield is achieved.

In a test in this wafer state, a large number of contact pins provided at a probe card are brought into electrical content with the terminals formed in the wafer to transfer electrical signals for testing.

As the contact pins used for a test in this wafer state, pins obtained by plating a gold alloy or other low hardness metal material on the surface of a base material made of a steel material so as to improve the closeness of contact with the terminals of the wafer at the time of contact have been known in the past.

However, such contact pins had the problems that since the metal materials are soft, the pins easily deformed upon contact with the terminals and therefore were inferior in terms of durability.

As opposed to this, as contact pins superior in durability, pins obtained using for example tungsten alloy or another high hardness metal material to make the pins themselves have been known in the past.

Using, an oxide film is formed over the terminals of a wafer. At the time of contact, the contact pins break this oxide film and reach the terminals themselves. At this time, since such contact pins are overall made of high hardness materials, the area of contact with the oxide film inevitably becomes larger, so there was the problem that the pushing force applied at the time of contact could not efficiently contribute to breakage of the oxide film and stable contact between the contact pins and terminals was difficult to secure. Further, in a probe card having several thousand contact pins, sometimes the pushing force applied at the time of contact with the terminals caused the probe card itself to bend. In such a case, poor contact with the terminals of the wafer easily occurs, so contact pins enabling stable contact with the terminals to be secured with a smaller pushing force have been desired.

DISCLOSURE OF THE INVENTION

An object of the present invention is to provide a contact pin superior in durability and enabling stable contact with a terminal to be secured with a smaller pushing force and a probe card and electronic device test apparatus using the same.

To achieve the above object, according to the present invention, there is provided a contact pin for contacting a terminal of an electronic device to supply said electronic device with a signal, provided with a first conductive layer composed of a first conductive material with a high hardness and a second conductive layer composed of a second conductive material with a lower hardness than said first conductive material (see claim 1).

In the present invention, the first conductive layer composed of the high hardness first conductive material breaks the oxide film formed on the terminal of the electronic device. At this time, in addition to this first conductive layer, by providing a second conductive layer composed of a second conductive material with a lower hardness than the first conductive material, it is possible to make the pushing force applied at the time of contact concentrate at the first conductive layer and possible to secure stable contact between the contact pin and terminal with a small pushing force.

Further, in the present invention, at the time of contact of the contact pin and terminal, the deformation of the second conductive layer due to the contact is prevented by the high hardness first conductive layer, so superior durability of the contact pin is secured.

While not particularly limited in the present invention said first conductive material preferably has a hardness higher than the oxide film formed on the terminal of said electronic device (see claim 2).

Due to this, the first conductive layer can effectively break the oxide film formed on the terminal of the electronic device to reach the surface of the terminal for electric contact.

While not particularly limited in the present invention, said second conductive material preferably has a lower hardness than the oxide film formed on the terminal of said electronic device (see claim 3).

Due to this, the second conductive layer becomes more easily worn than the first conductive layer and, along with a large number of pushing contacts with the terminal, the front end of the contact pin becomes a shape with the first conductive layer sticking out, so the pushing force applied at the time of contact more easily concentrates at the first conductive layer.

While not particularly limited in the present invention, specifically both said first conductive layer and said second conductive layer preferably are exposed at the front end face of the contact pin at the wafer side (see claim 4).

While not particularly limited in the present invention, said first conductive layer is preferably formed at the outside from said second conductive layer (see claim 5). More preferably, said first conductive layer is formed so as to be in close contact with the outside of said second conductive layer (see claim 6).

By adopting such an arrangement, it is possible to effectively secure stable contact between the contact pin and terminal with a small pushing force.

While not particularly limited in the present invention, said contact pin preferably is formed finely tapered at its front end (see claim 7).

Due to this, at the time of contact of the contact pin and terminal, the high hardness first conductive layer can be made to bite into the terminal to effectively break the oxide film.

While not particularly limited in the present invention, the pin is preferably further provided with a base material at the outside of which the first conductive layer and second conductive layer are formed, said base material being arranged inside said contact pin with the front end of that base material separated by a predetermined distance from the front end of said contact pin (see claim 8).

Due to this, even if the front end of the contact pin becomes worn, a new first and second conductive layer can be made to be exposed at the surface of the front end, so it is possible to maintain the front end of the contact pin in a stable shape and prolong the pin lifetime.

While not particularly limited in the present invention, preferably a plurality of at least of said first conductive layer or said second conductive layer is provided (see claim 9).

Due to this, it is possible to obtain a good adhesion between the conductive layers and mechanical strength, so it is possible to maintain the shape of the front end of the first conductive layer even with a frequent repeated pushing stress and promote the lifetime of the contact pin.

Further, to achieve the above object, according to the present invention, there is provided a probe card having the above contact pins electrically connected to a test head of an electronic device test apparatus and a board upon one main surface of which said contact pins are provided, said contact pins being brought into contact with terminals of an electronic device to test said electronic device (see claim 10).

Further, to achieve the above object, according to the present invention, there is provided an electronic device test apparatus having a test head to which the above probe card is electrically connected (see claim 11).

Due to this, there are provide a probe card and electronic device test apparatus using contact pins superior in durability and enabling stable contact with terminals to be secured with a small pushing force.

BEST MODE FOR WORKING THE INVENTION

Below, embodiments of the present invention will be explained with reference to the drawings.

A probe card 1 according to a first embodiment of the present invention, as shown in FIG. 1 to FIG. 5, is provided with a printed circuit board 10, a stiffener (reinforcing member) 20 provided at the test head side of this printed circuit board 10, upper and lower probe guides 30 and 40 provided at the opposite side to the test head of the printed circuit board 10, and a plurality of contact pins 50 supported by the probe guides 30 and 40.

Figure 5:
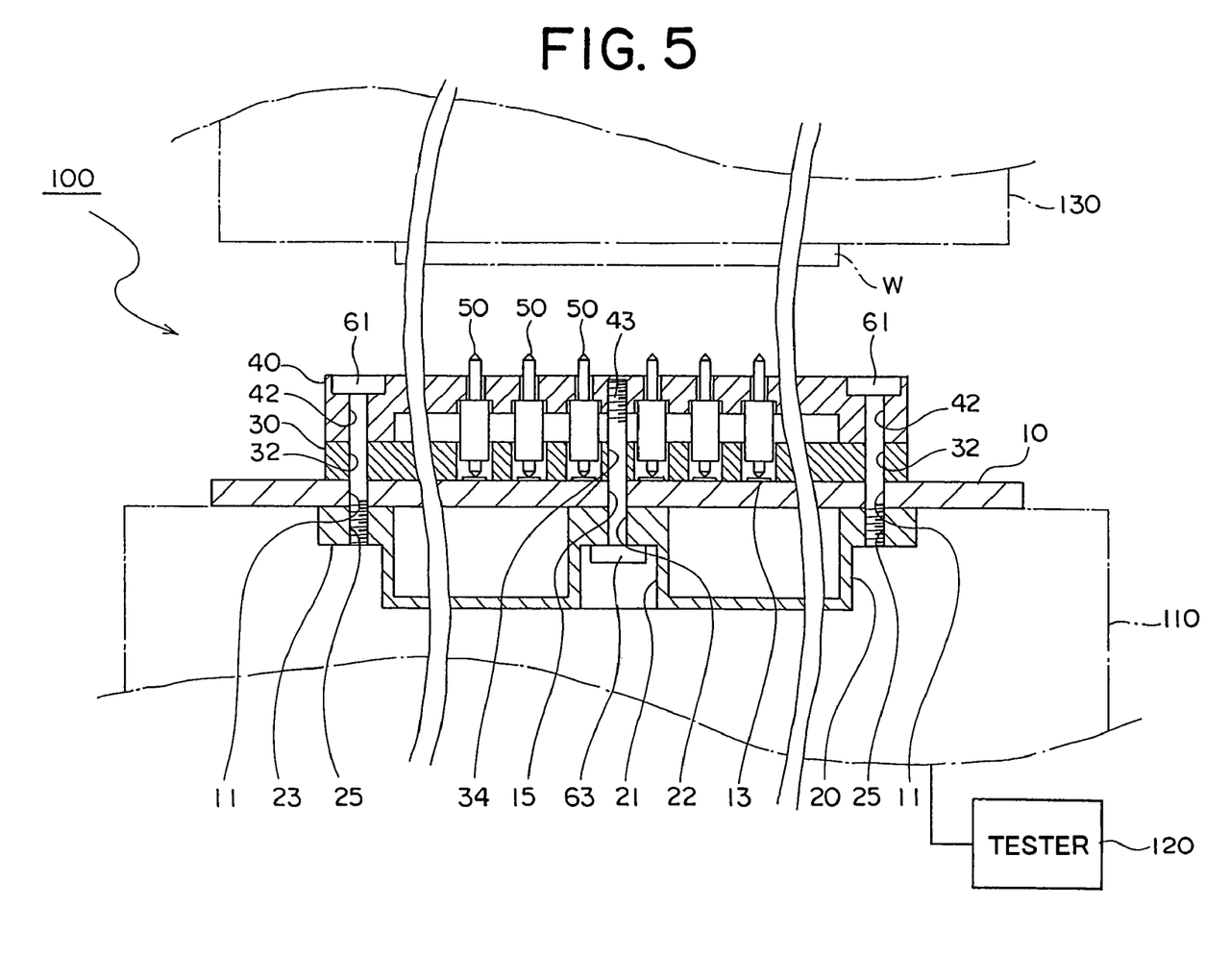
FIG. 5 is a disassembled perspective view showing the basic structure of the probe card shown in FIG. 1.

This probe card 1, as shown in FIG. 5, is electrically connected to a test head 110 of a semiconductor wafer test apparatus 100. This test head 110 is connected to a tester 120 by a cable. As opposed to this, a wafer W is held by suction to face this probe card 1 at an alignment system 130 of the semiconductor wafer test apparatus 100. This alignment system 130 is designed to be able to make the wafer W move relative to the probe card. Further, this semiconductor wafer test apparatus 100 positions the wafer W by the alignment system 130, then brings the contact pins 50 of the probe card 1 into contact with the terminals formed on the wafer W so as to test the semiconductor wafer W.

The probe guide 30 of this probe card 1 is directly arranged on the printed circuit board 10 at the side (surface) opposite to the test head to form a board side probe guide (below, the "probe guide 30" also being called a "board side probe guide 30").

As opposed to this, the probe guide 40 is stacked over the probe guide 30 and fastened to the probe guide 30 to form a wafer side probe guide (below, the "probe guide 40" also being called a "wafer side probe guide 40").

Figure 4:
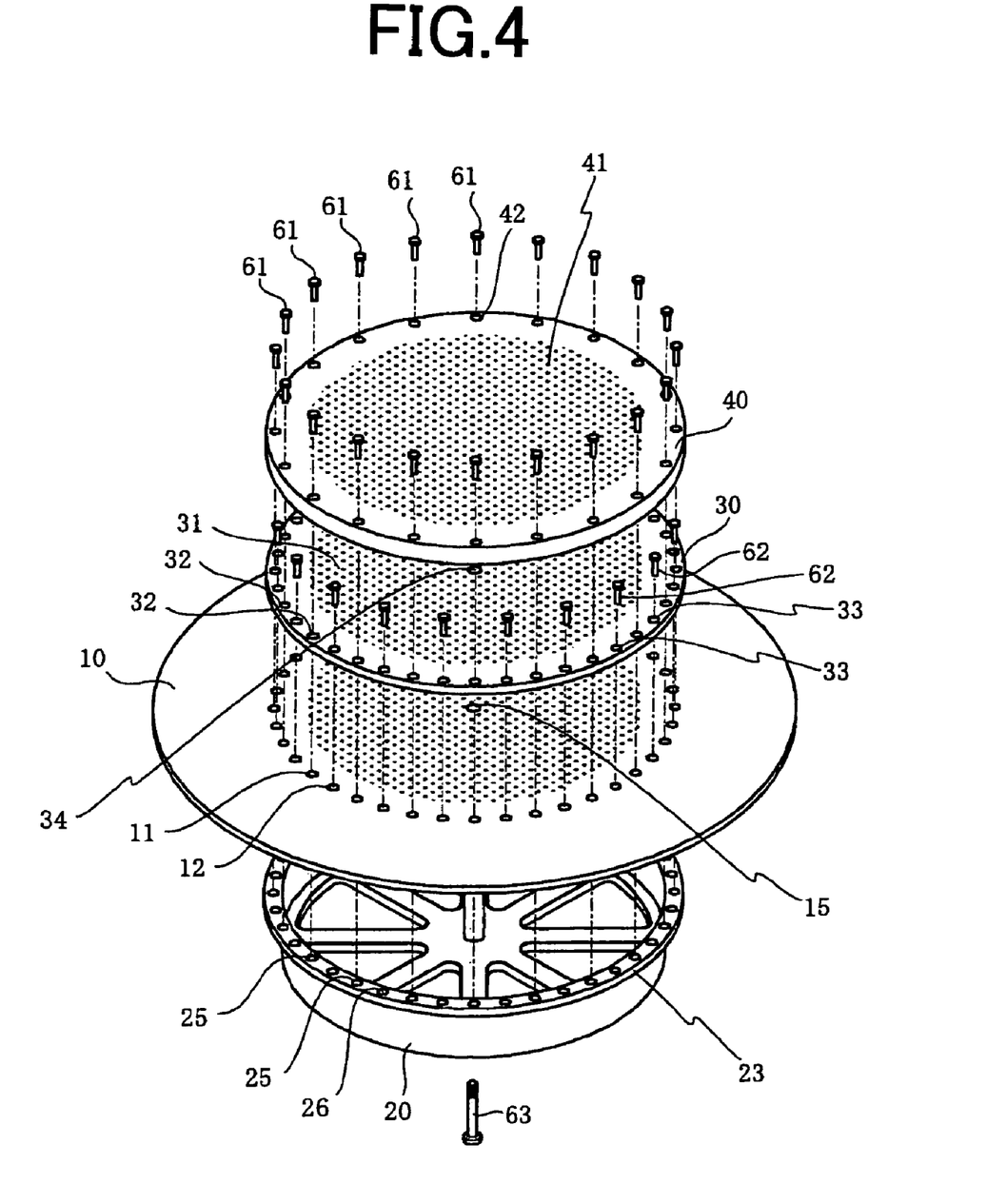
FIG. 4 is a disassembled perspective view showing the parts of the probe card shown in FIG. 1.

The probe guides 30 and 40 are formed with probe areas 31 and 41 corresponding to the tested semiconductor wafer. These probe areas 31 and 41 have pluralities of contact pins 50 arranged corresponding to the arrangements of terminals of the semiconductor wafer.

The peripheral edge of the board side probe guide 30 is formed with a plurality of through holes 32 through which screws 61 can pass and through holes 33 through which screws 62 can pass alternating with each other. Further, the board side probe guide 30 is formed at its center with a single through hole 34 through which a screw 63 can pass.

The peripheral edge of the wafer side probe guide 40 is formed with a plurality of through holes 42 through which screws 61 can pass. Further, the wafer side probe guide 40 is formed at its center rear side with a single threaded part 43 with which a screw 63 can be engaged.

The two probe guide 30 and 40 are, for example, made of ceramic, silicon, glass, or another material. In the present embodiment, they are made of materials having heat expansion coefficients substantially the same as the heat expansion coefficient of the tested semiconductor wafer.

Figure 1:
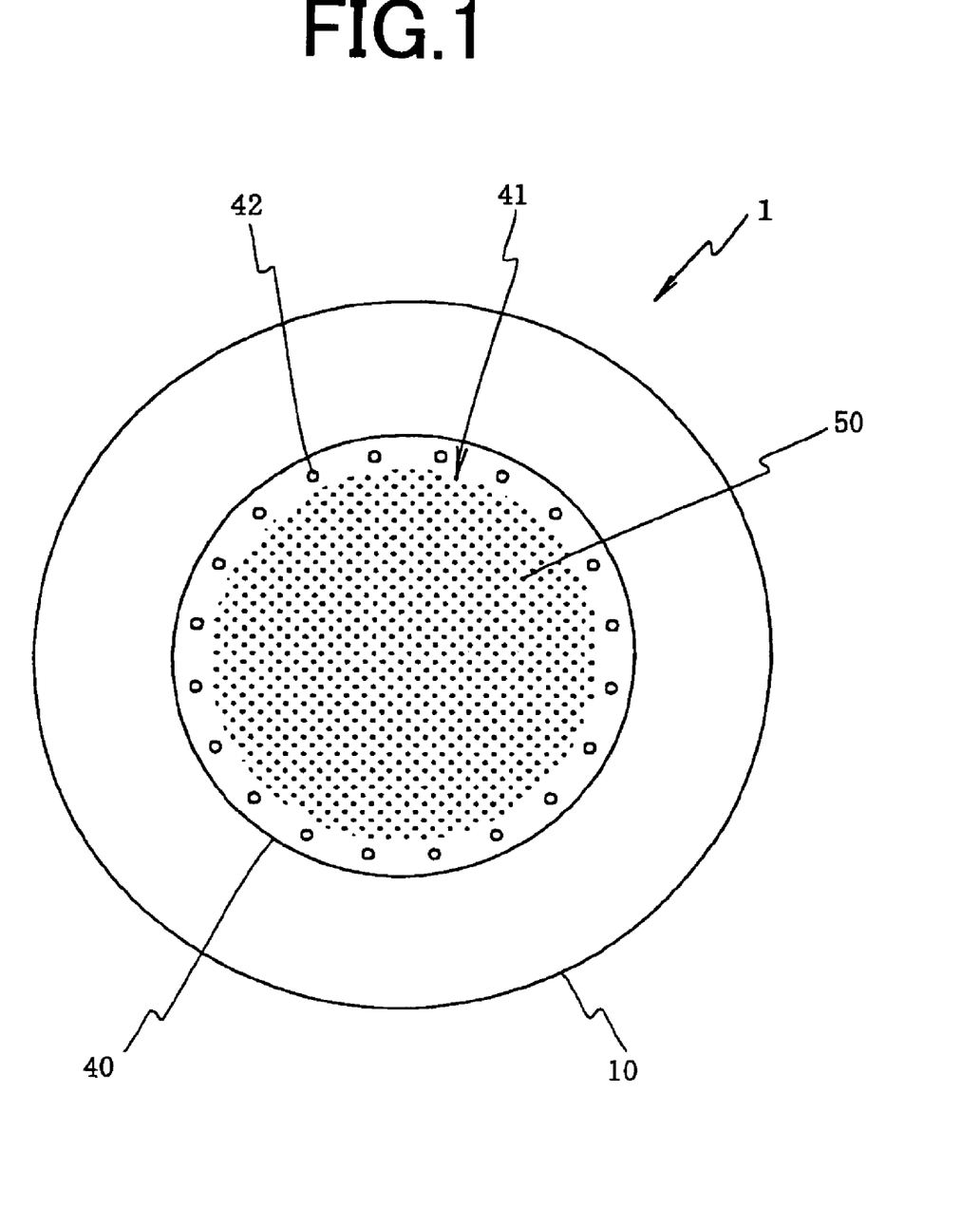
FIG. 1 is a plan view of a probe card according to a first embodiment of the present invention.
Figure 2:
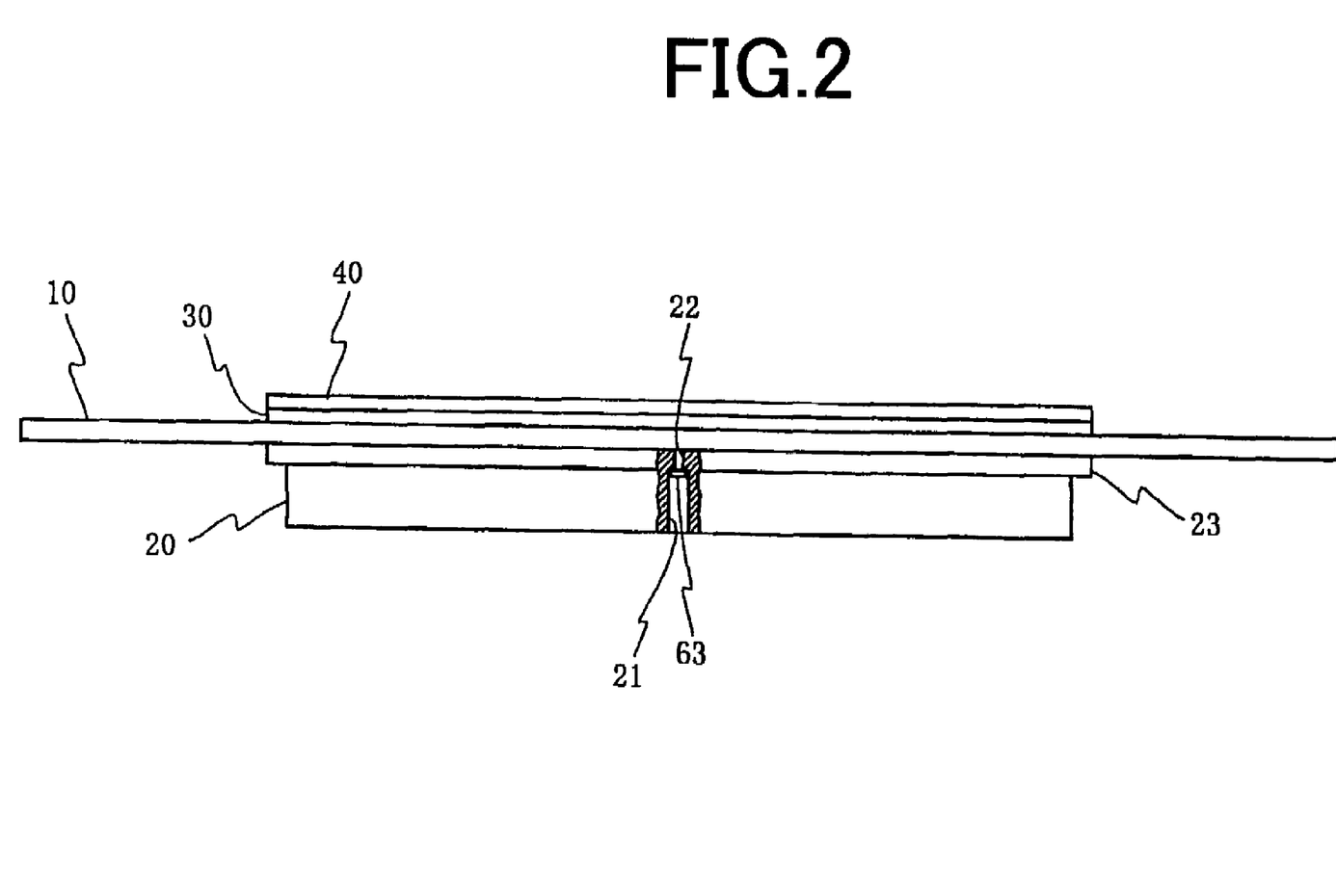
FIG. 2 is a side view of the probe card shown in FIG. 1.
Figure 3:
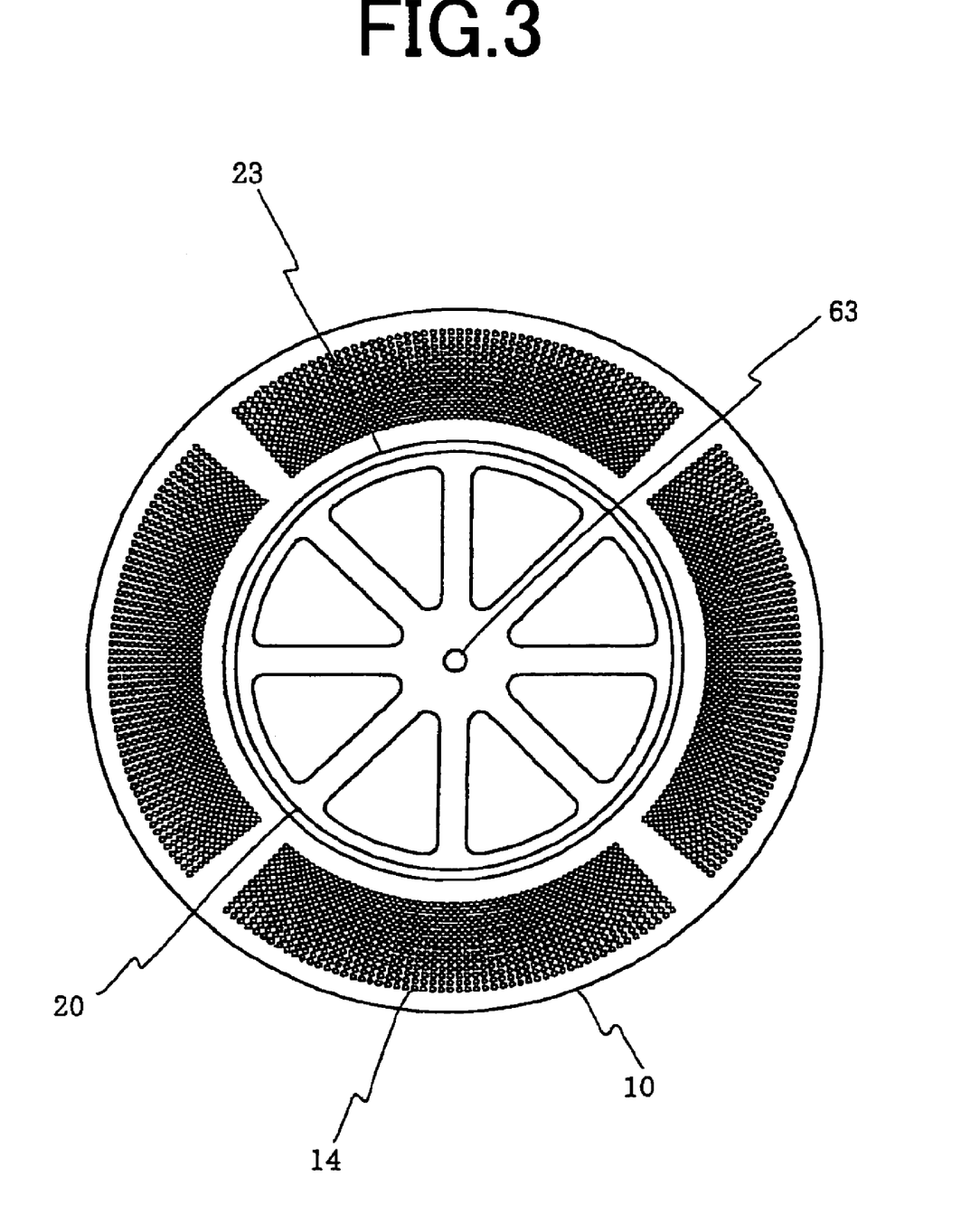
FIG. 3 is a rear view of the probe card shown in FIG. 1.

The printed circuit board 10 in the present embodiment has a thin disk shape having a diameter larger than the probe guides 30 and 40. This printed circuit board 10 is formed at the center of its surface with pads 13 as connection terminals to correspond to the arrangement of the terminals of the semiconductor wafer. Further, the printed circuit board 10 is formed at the outer circumference of its rear side with connection terminals 14 for transfer of electrical signals with the test head.

The printed circuit board 10 is formed with through holes 11 through which screws 61 can pass at positions corresponding to the through holes 32 and 42 of the probe guides 30 and 40. The printed circuit board 10 is formed with through holes 12 through which screws 62 can pass at positions corresponding to the through holes 33 of the probe guide 30. These through holes 11 and 12 are formed alternating with each other. Further, the printed circuit board 10 is formed at its center with a single through hole 15 through which a screw 63 can pass.

The stiffener 20 is provided at the center of the rear of the printed circuit board 10. In the present embodiment, it has an overall substantially dish shape at the peripheral edge of which a flange part 23 is formed. This flange part 23 is formed with threaded holes 25 with which the screws 61 can engage at positions corresponding to the threaded holes 32 and 42 of the probe guides 30 and 40. The flange part 23 is formed with threaded holes 26 with which the screws 62 can engage at positions corresponding to the threaded holes 33 of the probe guide 30. These threaded holes 25 and 26 are alternately formed.

Next, the contact pins 50 supported at the two probe guides 30 and 40 will be explained.

Figure 6:
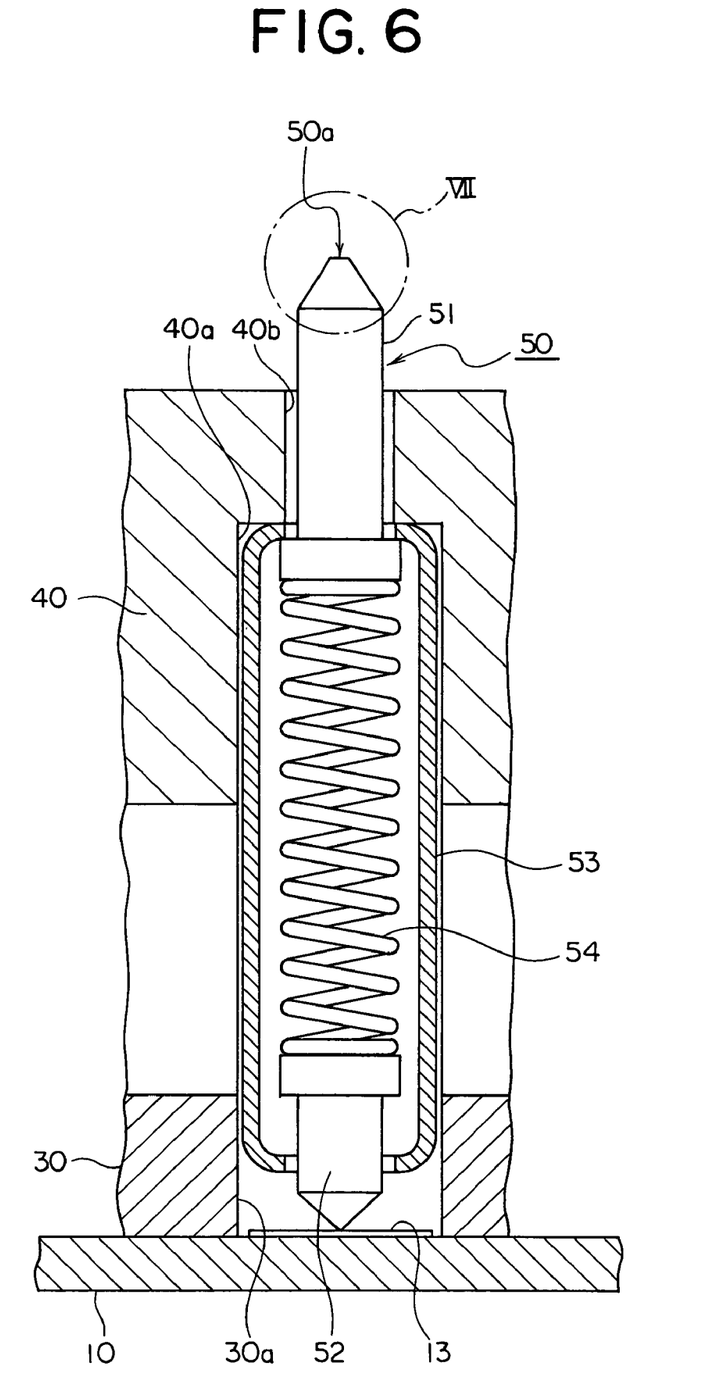
FIG. 6 is a partial cross-sectional view showing the unit structure of a contact pin.

As the contact pins 50 in the present embodiment, as shown in FIG. 5 and FIG. 6, vertical type spring contact pins (pogo pins) are used.

Each contact pin 50 is comprised of a cylindrical tube 53, a conductive coil spring 54 housed inside the tube 53, a conductive wafer side plunger 51 biased by the spring force of the coil spring 54 to the wafer side and fastened to the top end of the tube 53, and a conductive board side plunger 52 biased to the board side by the same coil spring 54 and fastened to the bottom end of the tube 53.

The vertical type contact pins 50 can be handled as independent members, so maintenance is easy.

The board side probe guide 30 is formed with holding holes 30a for supporting the tubes 53 of the contact pins 50 and holding the board side plungers 52 so as to pass through the board side probe guide 30. Further, the wafer side probe guide 40 is formed with support holes 40a for supporting the tubes 53 of the contact pins 50 and guide holes 40a for guiding the wafer side plungers 51 so as to pass through the wafer side probe guide 40.

The wafer side plunger 51 of each contact pin 50 sticks out a predetermined amount from the guide hole 40b of the wafer side probe guide 40 and is able to elastically retract in the downward direction due to the spring force of the coil spring 54. On the other hand, the board side plunger 52 of the contact pin 50 is held in the holding hole 30a of the board side probe guide 30 and in that state is brought into contact with a pad 13 of the printed circuit board 10 by a predetermined contact pressure due to the spring force of the coil spring 54.

In this state, the top end of the tube 53 of the contact pins 50 is biased by the spring force of the coil spring 54 and abuts against the top end face of the support hole 40a in the wafer side probe guide 40. In this way, the wafer side probe guide 40 is given an upward load by the contact pin 50.

Figure 7:
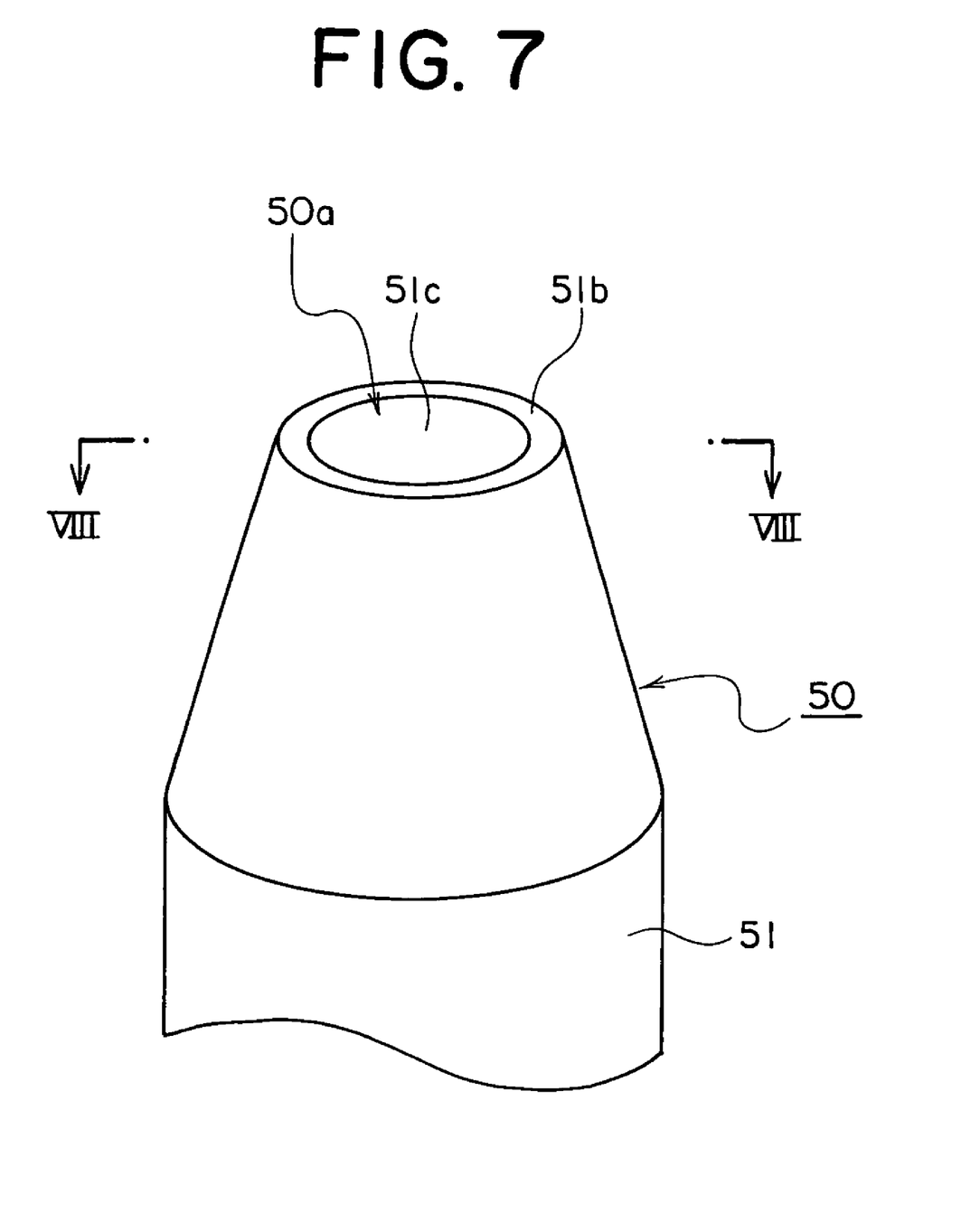
FIG. 7 is a partial perspective view of the part VII of FIG. 6.
Figure 8:
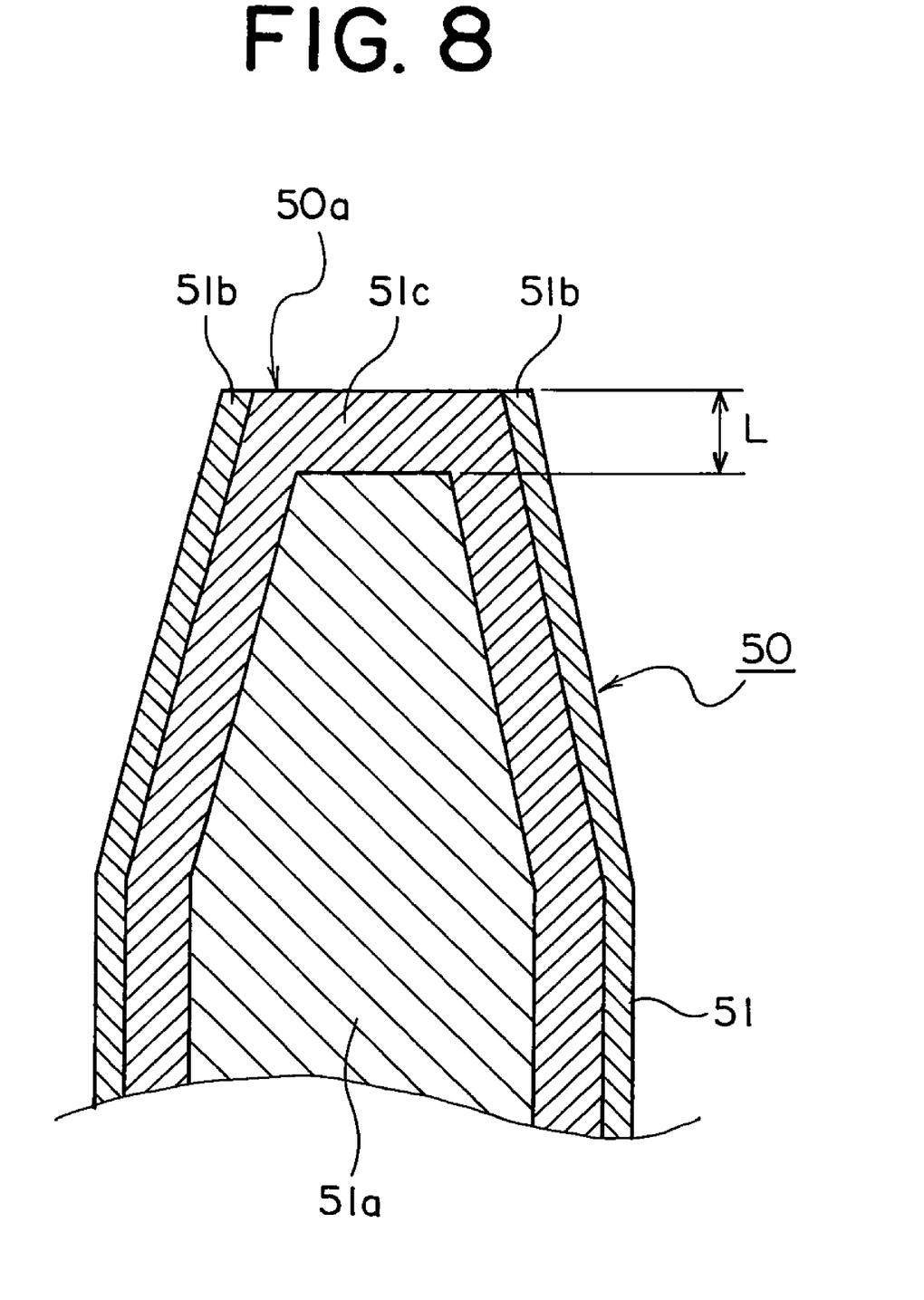
FIG. 8 is a cross-sectional view along the line of VIII-VIII of FIG. 7.

Further, the wafer side plunger 51 of each contact pin 50 according to the present embodiment, as shown in FIG. 7 and FIG. 8, is provided with a base material 51a made of for example stainless steel or another special steel, copper alloy, etc., a first conductive layer 51b with a high hardness, and a second conductive layer 51c with a lower hardness than that first conductive layer 51b. The second conductive layer 51c is formed at the outer circumference of the base material 51a, and the first conductive layer 51b is formed in a tube shape so as to tightly contact its outside. The front end is worked by for example polishing so that the second conductive layer 51c is exposed.

The first conductive layer 51b is formed by plating a base material 51a on which the second conductive layer 51c is formed with the first conductive material. As the first conductive material forming this first conductive layer 51b, for example, ruthenium, iridium, rhodium, chromium, nickel, alumite, their alloys or another conductive material with a higher hardness than the oxide film formed on the terminals of the electronic device may be mentioned.

This first conductive layer 51b has a hardness of at least a Vicker's hardness of 400 Hv, preferably has a hardness of at least a Vicker's hardness of 500 Hv. By the first conductive layer 51b having this hardness, for example, it can effectively break the oxide film ($Al_2O_3$, Vicker's hardness 400 Hv or so) formed on the surface of a general aluminum alloy terminal and the first conductive layer 51b can reach the surface of the terminal of the wafer and electrically contact it.

Note that when the contact pin itself is made of a high hardness material, machining is difficult and the workability is remarkably poor, but in the present embodiment, the base material 51a itself is made of a material superior in workability and is plated on its surface with the first conductive material, so both workability and high hardness can be achieved.

The second conductive layer 51c is formed by plating etc. the surface of the base material 51a with the second conductive material. As the second conductive material forming this second conductive layer 51c, for example, palladium, nickel, copper, gold, palladium nickel, tin, their alloys or another conductive material with a lower hardness than the oxide film formed on the terminal of the electronic device may be mentioned.

This second conductive layer 51c has a hardness of not more than a Vicker's hardness of 400 Hv. Due to this, the second conductive layer 51c is more easily worn than the first conductive layer 51b with a large number of pressed contacts, so the first conductive layer 51b projects out in a ring shape at the contact face 50a. That is, since the pushing force easily concentrates at the small area ring shaped first conductive layer 51b, even with a smaller pushing force, the oxide film can be easily broken and the first conductive layer 51b can reach the surface of the terminal of the wafer and electrically contact it. Further, even with a large number of pressed contacts, the high hardness first conductive layer 51b enables the contact pin 50 to be maintained in its front end shape, so a contact pin enabling stable electrical contact can be realized.

The wafer side plunger 51 having this layer structure is tapered thin at its front end. For example, at the initial polishing, polishing paper etc. is used to polish its front end. Both the first conductive layer 51b and second conductive layer 51c are exposed at the front end face 50a of the contact pin 50.

In the present embodiment, by finely tapering the front end of the contact pin 50, when the contact pin 50 contacts the terminal, the high hardness first conductive layer 51b can sharply bite into the terminal to effectively and can break the oxide film formed on the terminal.

Further, in the present embodiment, the base material 51a is thickly plated by the second conductive layer 51c so that it is arranged at the inside of the contact pin 50 so that its front end is separated from the front end face 50a of the contact pin 50 by a predetermined distance L (see FIG. 8).

In general, along with the tens of thousands of times of press contact with terminals of wafers, the front end of a contact pin 50 gradually becomes worn, but with the contact pin 50 of the present embodiment, the length of the distance L enables the first and second conductive layers 51b and 51c to be newly exposed at the front end face 50a, so the contact pin 50 can be stably maintained in the shape of its front end and can be extended in lifetime.

When a contact pin 50 of such a configuration contacts a terminal formed on a wafer, first, the high hardness first conductive layer 51b breaks the oxide film formed on the terminal. At this time, since the ring shape projecting first conductive layer 51b contacting the oxide film is small in area, a smaller pushing force enables breakage. At the same time, the second conductive layer 51c contacts the terminal, but this second conductive layer 51c is low in hardness, so the majority of the pushing force concentrates at the first conductive layer 51b and as a result a small pushing force secures stable contact between the contact pin and terminal.

Further, at the time of contact between the contact pin 50 and terminal, deformation of the second conductive layer 51c due to the contact is prevented by the high hardness first conductive layer 51b, so a superior durability of the contact pin 50 is secured.

Figure 9:
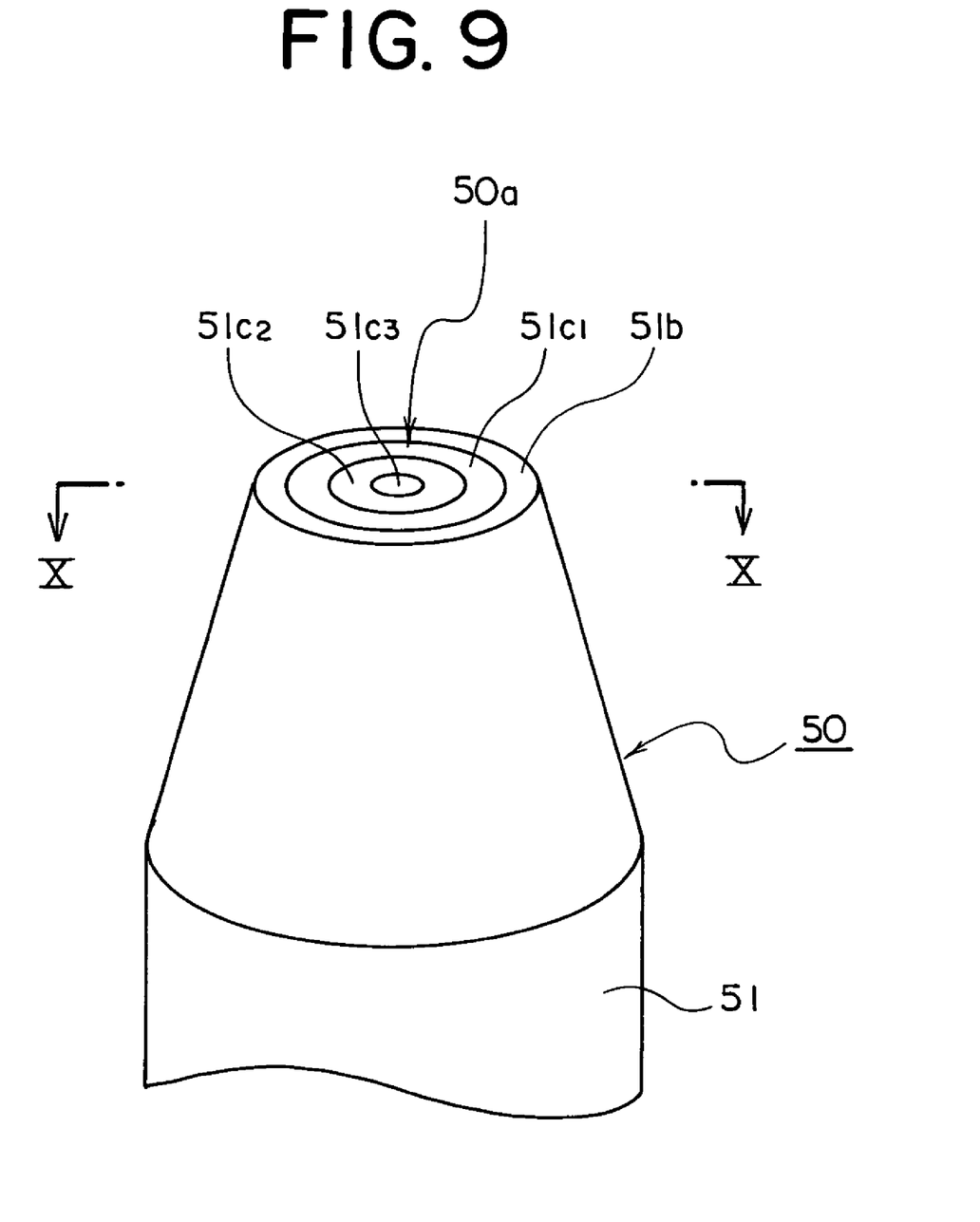
FIG. 9 is a partial perspective view showing the front end of a contact pin according to a second embodiment of the present invention.
Figure 10:
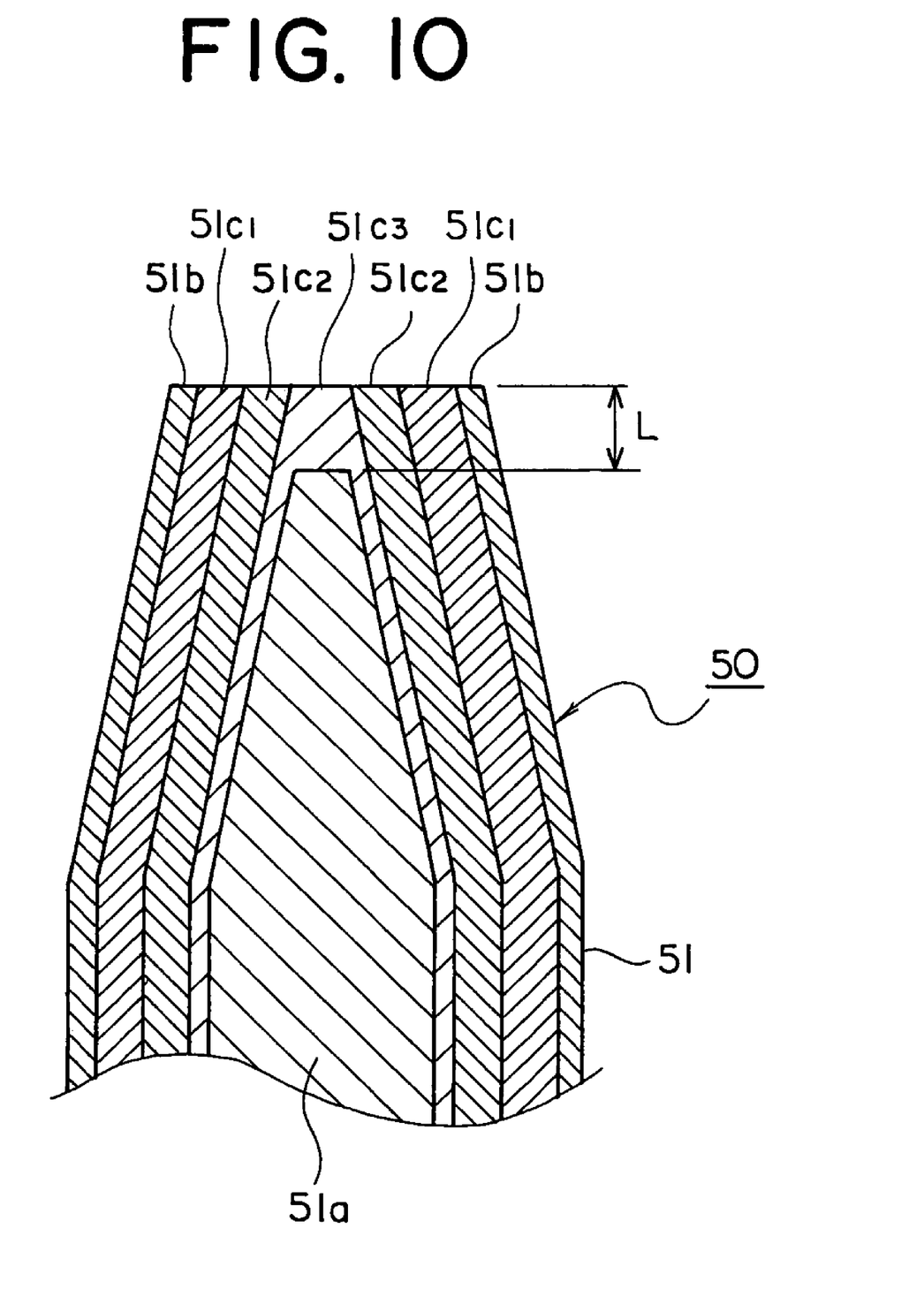
FIG. 10 is cross-sectional view along the line X-X of FIG. 9.

FIG. 9 and FIG. 10 are views of the front end of a contact pin according to a second embodiment of the present invention.

The contact pin according to the second embodiment of the present invention is provided with, as a second conductive layer, a total of the three layers of a second outside conductive layer $51c_1$, second intermediate conductive layer $51c_2$, and second inside conductive layer $51c_3$.

The second outside conductive layer $51c_1$ is formed by plating the base material $51a$ formed with the second intermediate conductive layer $51c_2$ and second inside conductive layer $51c_3$ with the second conductive material. Similarly, the second intermediate conductive layer $51c_2$ is formed by plating the base material $51a$ formed with the second inside conductive layer $51c_3$ with the second conductive material, while the second inside conductive layer $51c_3$ is formed by plating the outer circumference of the base material $51a$ with the second conductive material.

The second outside conductive layer $51c_{1b}$ and the second intermediate conductive layer $51c_2$ are both, for example, formed by a combination of layers made of two types of materials selected from palladium, nickel, copper, gold, palladium, nickel, tin, their alloys or another second conductive material and have the same layer structure. As opposed to this, the second inside conductive layer $51c_3$ is made of another type of material from among the above second conductive materials. The base material $51a$ and plating layers are preferably used as combinations of materials with good adhesion.

In this way, by providing a plurality of second conductive layers to obtain a good adhesion strength and mechanical strength of the plating layers, the first conductive layer $51b$ positioned at the outermost layer and projecting out in a ring shape can maintain its mechanical shape with respect to frequent repeated pressing stress. As a result, the contact pin 50 can be extended in lifetime.

Figure 11:
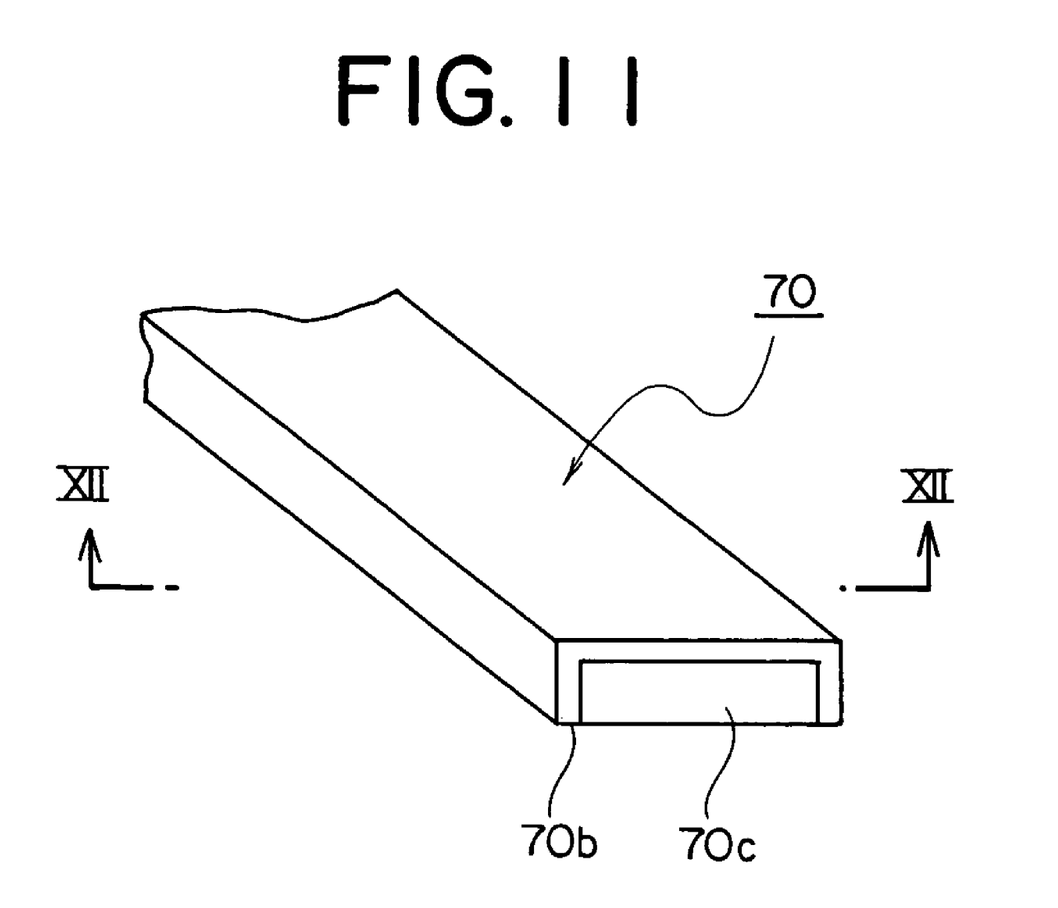
FIG. 11 is a partial perspective view showing the front end of a contact pin according to a third embodiment of the present invention.
Figure 12:
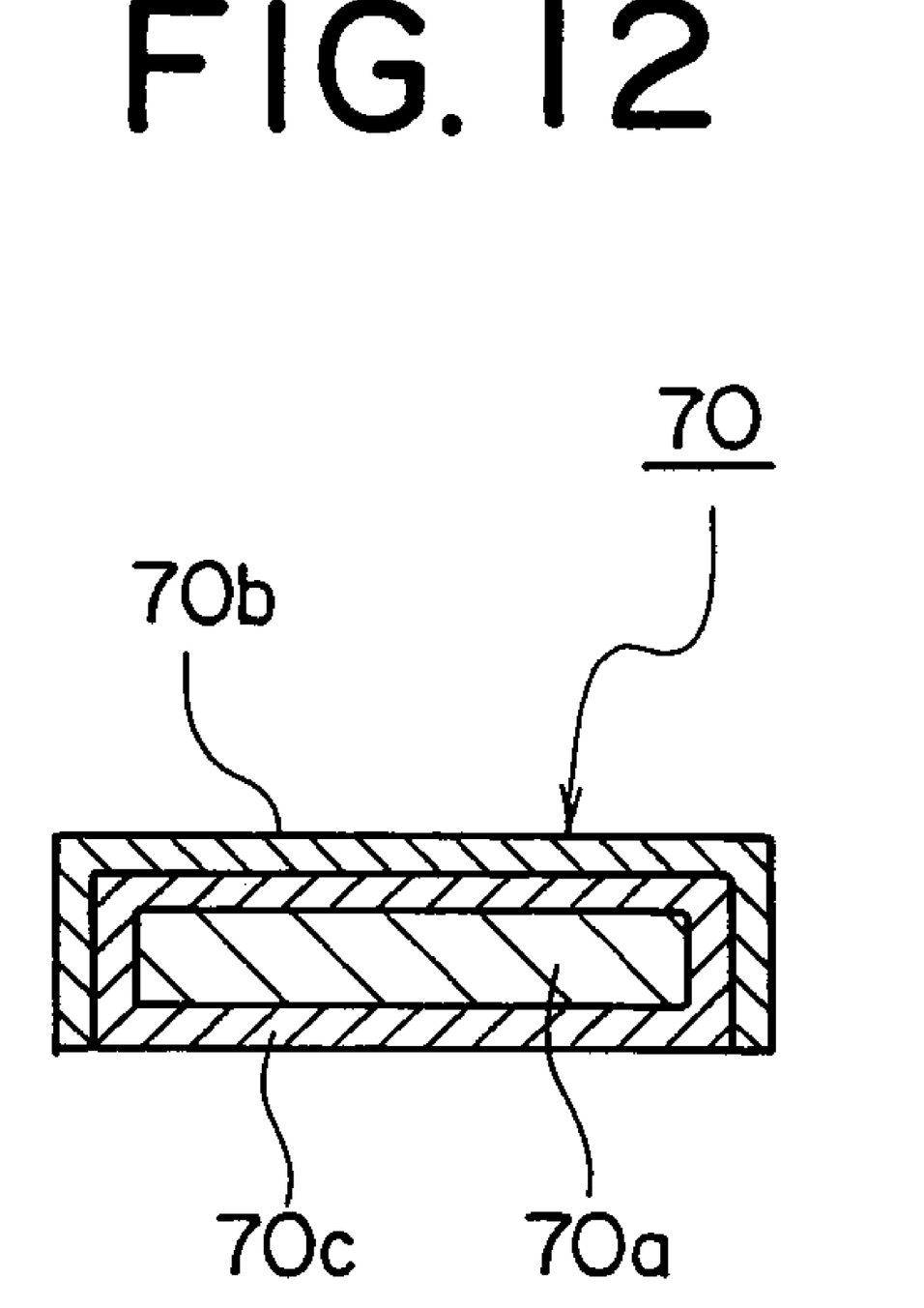
FIG. 12 is a cross-sectional view along the line XII-XII of FIG. 11.

FIG. 11 and FIG. 12 are view of the front end of a contact pin according to a third embodiment of the present invention.

The configuration explained above is not limited to the vertical type spring contact pin (pogo pin) type. As illustrated, it may also be applied to a cantilever contact pin 70 (needle).

The contact pin 70 in this case, like in the first embodiment, is for example provided with a base material $70a$ made of stainless steel or another special steel, copper alloy, etc., a high hardness first conductive layer $70b$ made of for example ruthenium, iridium, rhodium, chromium, nickel, alumite, or their alloys etc., and a low hardness second conductive layer $70c$ made of for example palladium, nickel, copper, gold, palladium nickel, tin, or their alloys. The base material $70a$ is formed on its surface with a second conductive layer $70c$ by plating etc. and is further formed over that with a first conductive layer $70b$ by plating etc.

This contact pin 70 is, for example, polished at the wafer side surface by polishing paper etc. at the time of the initial polishing so that both the first and second conductive layers $70b$ and $70c$ are exposed and the first conductive layer $70b$ and second conductive layer $70c$ can simultaneously contact the terminal at the time of contact.

Note that the above explained embodiments were described to facilitate understanding of the present invention and were not described to limit the present invention. Therefore the elements disclosed in the above embodiments include all design modifications and equivalents falling under the technical scope of the present invention.

The invention claimed is:

1. A contact pin for contacting a terminal of an electronic device to supply the electronic device with a signal, the contact pin comprising:

a first conductive layer composed of a first conductive material; and a second conductive layer composed of a second conductive material with a lower hardness than the first conductive material, wherein the first conductive layer is formed at the outside from the second conductive layer, the contact pin has a truncated cone shape which has a first flat surface at the front end and a first taper portion which tapers toward the first flat surface, the first flat surface is orthogonal to the axis of the contact pin, and the second conductive layer is exposed at the first flat surface.

2. The contact pin as set forth in claim 1, wherein the first conductive material has a hardness higher than an oxide film formed on the terminal of the electronic device; and the second conductive material has a lower hardness than the oxide film formed on the terminal of the electronic device.

3. The contact pin as set forth in claim 1, wherein the contact pin has a circular cylindrical shape with the truncated cone shape.

4. The contact pin as set forth in claim 1, wherein the contact pin further comprises a base material at the outside of which the first conductive layer and the second conductive layer are formed, wherein the base material has a second flat surface at the front end and a second taper portion which tapers toward the second flat surface, the second flat surface is orthogonal to the axis of the contact pin, and the second conductive layer covers the second flat surface.

5. The contact pin as set forth in claim 1, wherein the first conductive layer is formed so as to be in close contact with the outside of the second conductive layer.

6. The contact pin as set forth in claim 1, wherein the first conductive layer circularly surrounds the second conductive layer in the first flat surface, and the front end of the first conductive layer and the second conductive layer are in the same plane.

7. The contact pin as set forth in claim 1, wherein a plurality of at least of said first conductive layer or said second conductive layer is provided.

8. A probe card having contact pins of claim 1 electrically connected to a test head of an electronic device test apparatus and a board upon one main surface of which the contact pins are provided, the contact pins being brought into contact with terminals of an electronic device to test the electronic device.

9. The probe card as set forth in claim 8, wherein the first conductive material has a hardness higher than an oxide film formed on the terminal of the electronic device, and the second conductive material has a lower hardness than the oxide film formed on the terminal of the electronic device.

10. The probe card as set forth in claim 8, wherein the contact pin has a circular cylindrical shape with the truncated cone shape.

11. The probe card as set forth in claim 8, wherein the contact pin further comprises a base material at the outside of which the first conductive layer and the second conductive layer are formed, wherein the base material has a second flat surface at the front end and a second taper portion which tapers toward the second flat surface, the second flat surface is orthogonal to the axis of the contact pin, and the second conductive layer covers the second flat surface.

12. The probe card as set forth in claim 8, wherein the first conductive layer is formed so as to be in close contact with the outside of the second conductive layer.

13. The probe card as set forth in claim 8, wherein the first conductive layer circularly surrounds the second conductive layer in the first flat surface, and the front end of the first conductive layer and the second conductive layer are in the same plane.

14. The probe card as set forth in claim 8, wherein a plurality of at least of said first conductive layer or said second conductive layer is provided.

15. An electronic device test apparatus having a test head to which a probe card of claim 8 is electrically connected.

16. The electronic device test apparatus as set forth in claim 15, wherein the first conductive material has a hardness higher than an oxide film formed on the terminal of the electronic device, and the second conductive material has a lower hardness than the oxide film formed on the terminal of the electronic device.

17. The electronic device test apparatus as set forth in claim 15, wherein the contact pin has circular cylindrical shape with the truncated cone shape.

18. The electronic device test apparatus as set forth in claim 15, wherein the contact pin further comprises a base material at the outside of which the first conductive layer and the second conductive layer are formed, wherein the base material has a second flat surface at the front end and a second taper portion which tapers toward the second flat surface, the second flat surface is orthogonal to the axis of the contact pin, and the second conductive layer covers the second flat surface.

19. The electronic device test apparatus as set forth in claim 15, wherein the first conductive layer is formed so as to be in close contact with the outside of the second conductive layer.

20. The electronic device test apparatus as set forth in claim 15, wherein the first conductive layer circularly surrounds the second conductive layer in the first flat surface, the front end of the first conductive layer and the front end of the second conductive layer are in the same plane.

21. The electronic device test apparatus as set forth in claim 15, wherein a plurality of at least of said first conductive layer or said second conductive layer is provided.

* * * * *